US 11,719,753 B2

(12) United States Patent
Brown

(10) Patent No.: US 11,719,753 B2
(45) Date of Patent: *Aug. 8, 2023

(54) METHOD AND SYSTEM FOR PREDICTING ENERGY CONSUMPTION OF A VEHICLE THROUGH APPLICATION OF A STATISTICAL MODEL UTILIZING ENVIRONMENTAL AND ROAD CONDITION INFORMATION

(71) Applicant: Invently Automotive Inc., Los Altos, CA (US)

(72) Inventor: Stephen J. Brown, Woodside, CA (US)

(73) Assignee: INVENTLY AUTOMOTIVE INC., Los Altos, CA (US)

( * ) Notice: Subject to any disclaimer, the term of this patent is extended or adjusted under 35 U.S.C. 154(b) by 1050 days.

This patent is subject to a terminal disclaimer.

(21) Appl. No.: 15/793,390

(22) Filed: Oct. 25, 2017

(65) Prior Publication Data
US 2018/0080991 A1    Mar. 22, 2018

Related U.S. Application Data

(63) Continuation of application No. 14/192,645, filed on Feb. 27, 2014, now Pat. No. 9,841,463.

(51) Int. Cl.
*G01R 31/36* (2020.01)
*G06F 17/18* (2006.01)
(Continued)

(52) U.S. Cl.
CPC ..... *G01R 31/3648* (2013.01); *B60W 30/0956* (2013.01); *B60W 50/0097* (2013.01);
(Continued)

(58) Field of Classification Search
CPC . G06F 17/18; G01L 5/13; G01L 17/00; G01L 3/26; G01R 31/36; G01R 31/3648
See application file for complete search history.

(56) References Cited

U.S. PATENT DOCUMENTS 5,732,377 A * 3/1998 Eckert ................. B60T 8/1755
303/140
5,735,584 A * 4/1998 Eckert ................. B60T 8/1755
303/140
(Continued)

FOREIGN PATENT DOCUMENTS

EP        1885576        2/2008
JP        2011-232296    11/2011    ............. G01C 21/34
(Continued)

OTHER PUBLICATIONS

T. Mu and et el, "Heterogeneous Delay Embedding for Travel Time and Energy Cost Prediction Via Regression Analysis", IEEE transactions on intelligent transportation systems, vol. 14, No. 1, Mar. 2013 (Year: 2013).*
(Continued)

*Primary Examiner* — Douglas Kay
(74) *Attorney, Agent, or Firm* — David R. Stevens; Stevens Law Group

(57) ABSTRACT

A method for predicting energy consumption of a vehicle using a statistical model. The method includes (i) predicting a set of future input vectors for the vehicle at defined time intervals corresponding to a plurality of future points in time based on a subset of a plurality of reference input vectors previously generated at the defined time intervals at a plurality of previous points in time, (ii) predicting a change in the energy level of the vehicle using a processor and the statistical model, and (iii) providing results corresponding to the predicted change in the energy level to an output unit of the vehicle. Each reference input vector comprises a vehicle input vector and a database input vector associated with each point in time of the plurality of previous points in time. The database input vector for each defined time interval may be
(Continued)

based on at least one of a plurality of environmental data and information about a road condition.

18 Claims, 5 Drawing Sheets

(51) Int. Cl.

| | |
|---|---|
| *G01L 5/13* | (2006.01) |
| *B60W 30/095* | (2012.01) |
| *G05D 1/02* | (2020.01) |
| *G08G 1/01* | (2006.01) |
| *G05B 23/02* | (2006.01) |
| *G06N 5/048* | (2023.01) |
| *G05B 13/04* | (2006.01) |
| *G06N 20/00* | (2019.01) |
| *G06Q 10/04* | (2023.01) |
| *B60W 50/00* | (2006.01) |
| *G01C 21/34* | (2006.01) |
| *G01R 31/367* | (2019.01) |
| *G01L 17/00* | (2006.01) |
| *G01L 3/26* | (2006.01) |

(52) U.S. Cl.
CPC ............ *G01C 21/3469* (2013.01); *G01L 5/13* (2013.01); *G05B 13/048* (2013.01); *G05B 23/0254* (2013.01); *G05D 1/0214* (2013.01); *G05D 1/0221* (2013.01); *G06F 17/18* (2013.01); *G06N 5/048* (2013.01); *G06N 20/00* (2019.01); *G06Q 10/04* (2013.01); *G08G 1/0104* (2013.01); *G08G 1/0125* (2013.01); *G08G 1/0129* (2013.01); *G01L 3/26* (2013.01); *G01L 17/00* (2013.01); *G01R 31/367* (2019.01)

(56) References Cited

U.S. PATENT DOCUMENTS

| | | | | |
|---|---|---|---|---|
| 5,742,507 | A * | 4/1998 | Eckert | B60K 31/00 180/197 |
| 6,278,915 | B1 | 8/2001 | Deguchi | 180/65.235 |
| 6,438,430 | B1 * | 8/2002 | Martin | G05B 17/02 700/28 |
| 6,990,401 | B2 | 1/2006 | Neiss | |
| 7,076,350 | B2 * | 7/2006 | Ivarez-Troncoso | B60W 10/08 701/36 |
| 7,925,426 | B2 | 4/2011 | Koebler et al. | |
| 7,948,400 | B2 * | 5/2011 | Horvitz | G08G 1/0104 340/933 |
| 8,155,868 | B1 * | 4/2012 | Xing | G07C 5/0808 340/439 |
| 8,301,365 | B2 | 10/2012 | Niwa et al. | |
| 8,386,169 | B2 | 2/2013 | Nguyen | |
| 8,478,514 | B2 * | 7/2013 | Kargupta | G06Q 10/08 701/300 |
| 8,543,287 | B2 | 9/2013 | Stevens et al. | |
| 8,855,880 | B2 * | 10/2014 | Rowker | B60L 7/24 701/70 |
| 8,972,161 | B1 | 3/2015 | Koebler | 304/995.27 |
| 9,043,106 | B2 * | 5/2015 | Ingram | B64D 27/24 701/70 |
| 9,159,232 | B2 * | 10/2015 | Ricci | G06F 13/364 |
| 9,217,779 | B2 * | 12/2015 | Xu | H04Q 9/00 |
| 9,393,963 | B2 | 7/2016 | Slaton | |
| 10,445,758 | B1 * | 10/2019 | Bryer | G06Q 40/08 |
| 2004/0048118 | A1 * | 3/2004 | Nakaji | B60L 58/33 429/429 |
| 2004/0224577 | A1 * | 11/2004 | Kaji | G05B 13/0275 440/1 |
| 2005/0288850 | A1 | 12/2005 | Sato | 701/123 |
| 2006/0020352 | A1 * | 1/2006 | Martin | G05B 17/02 700/28 |
| 2007/0027593 | A1 * | 2/2007 | Shah | B60W 50/00 701/29.4 |
| 2007/0138347 | A1 * | 6/2007 | Ehlers | G01C 21/34 246/1 R |
| 2008/0086240 | A1 | 4/2008 | Breed | |
| 2008/0249667 | A1 * | 10/2008 | Horvitz | B60W 40/12 701/1 |
| 2009/0157254 | A1 * | 6/2009 | Nishida | G01D 7/02 701/36 |
| 2010/0138142 | A1 | 6/2010 | Pease | |
| 2011/0082632 | A1 * | 4/2011 | Rowker | B60K 35/00 340/453 |
| 2011/0184642 | A1 * | 7/2011 | Rotz | G01C 21/3492 701/533 |
| 2011/0184784 | A1 * | 7/2011 | Rudow | G06Q 30/02 705/7.38 |
| 2011/0258044 | A1 * | 10/2011 | Kargupta | G06Q 30/0251 705/14.49 |
| 2012/0022781 | A1 * | 1/2012 | Wilson | G01C 21/3415 701/410 |
| 2012/0083960 | A1 * | 4/2012 | Zhu | G05D 1/0276 701/23 |
| 2013/0041552 | A1 * | 2/2013 | MacNeille | G01C 21/3469 701/32.9 |
| 2013/0054125 | A1 | 2/2013 | Bruemmer | 701/123 |
| 2013/0073113 | A1 | 3/2013 | Wang et al. | |
| 2013/0085696 | A1 * | 4/2013 | Xu | G01R 31/367 702/63 |
| 2013/0144470 | A1 * | 6/2013 | Ricci | G06Q 30/0265 701/2 |
| 2013/0184901 | A1 | 7/2013 | Wall et al. | |
| 2013/0261914 | A1 * | 10/2013 | Ingram | B64D 27/24 701/70 |
| 2013/0289819 | A1 * | 10/2013 | Hassib | G07C 5/006 701/1 |
| 2014/0122045 | A1 * | 5/2014 | Mewes | G06F 30/20 703/6 |
| 2014/0196529 | A1 * | 7/2014 | Cronin | E01C 23/06 73/146 |
| 2014/0207363 | A1 | 7/2014 | Kanno | 701/123 |
| 2014/0222321 | A1 * | 8/2014 | Petty | G01C 21/3492 701/117 |
| 2015/0019132 | A1 * | 1/2015 | Gusikhin | G01C 21/3469 701/537 |
| 2015/0025917 | A1 * | 1/2015 | Stempora | G02B 27/0093 705/4 |
| 2016/0153807 | A1 * | 6/2016 | Zuta | G01P 3/487 324/207.2 |
| 2016/0311423 | A1 * | 10/2016 | Storm | B60L 58/12 |
| 2018/0170349 | A1 * | 6/2018 | Jobson | B60W 20/11 |

FOREIGN PATENT DOCUMENTS

| | | | |
|---|---|---|---|
| WO | WO2010/052043 | 5/2010 | ............ G01C 21/34 |
| WO | WO2011/123690 | 10/2011 | ............ H01M 10/44 |

OTHER PUBLICATIONS

N. I. Sapankevych and R. Sanka, Time Series Prediction using SVMs: A surevy, IEEE Computational Intelligence Magazine | May 2009 (Year: 2019).*

Rodgers, Lennon P., "Electric Vehicle Design, Racing and Distance to Empty Algorithms", Doctor of Philosophy Thesis, Massachusetts Institute of Technology, Jun. 25, 2013, pp. 1-108.

Simpson et al., "The Ultracommuter: A Viable and Desirable Solar-Powered Commuter Vehicle", Australasian Universities Power of Engineering Conference AUPEC'02, Melbourne, Australia, 2002, 7 pages.

Rizzo, Gianfranco et al., "Solar energy for cars: perspectives, opportunities and problems", GTAA Meeting, Mulhouse, May 26-27, 2010, 6 pages.

(56) References Cited

OTHER PUBLICATIONS

Ahman, Max, "Primary energy efficiency of alternative powertrains in vehicles", Energy 26 (20010, Elsevier), Jun. 23, 2000, pp. 973-989.

Absuleme, Angel, "Improved Performance of a Battery Powered Electric Car, Using Photovoltaic Cells", Proceedings of the 2003 IEEE PowerTech Conference, Bologna, Italy, Jun. 23-26, 2003, pp. 1-6.

* cited by examiner

METHOD AND SYSTEM FOR PREDICTING ENERGY CONSUMPTION OF A VEHICLE THROUGH APPLICATION OF A STATISTICAL MODEL UTILIZING ENVIRONMENTAL AND ROAD CONDITION INFORMATION

This application relates to U.S. Ser. No. 14/192,645, filed Feb. 27, 2014, which is incorporated by reference in its entirety.

BACKGROUND

Technical Field

The embodiments herein generally relate to statistical analysis for automotive applications, and more particularly to predicting energy consumption of a vehicle using a statistical model.

Description of the Related Art

Predicting energy consumption for a vehicle is valuable for determining future travel conditions of the vehicle. Energy consumption referred to herein includes both electrical energy consumption and fuel consumption. There exist technologies that predict the energy consumption based on factors such as current operating parameters of the vehicle, environmental factors, and road conditions. These technologies predict the energy consumption based on factors that affect the driving conditions and the vehicle at a particular point in time. Such technologies collect data associated with energy consumption, velocity, vehicle type using probe vehicles, and predict the energy consumption based on actual results of the collected data in the past.

There is a need of an in-vehicle module that utilizes a statistical model to accurately predict energy consumption of the vehicle based on varying factors that affect the vehicle and the driving conditions. In addition, there is a need of an in-vehicle module that dynamically learns about the varying factors in order to improve accuracy of later predictions.

SUMMARY

In view of the foregoing, the embodiments herein provide a method for predicting energy consumption of a vehicle using a statistical model, and non-transitory program storage device readable by computer, and comprising a program of instructions executable by the computer to perform a method for predicting energy consumption of a vehicle using a statistical model, the method comprising: obtaining a plurality of input vectors for the vehicle at defined time intervals at a plurality of points in time, wherein each input vector is associated with each point in time of the plurality of points in time; capturing an energy level associated with each input vector of the plurality of input vectors at each point in time for the vehicle, wherein the energy level corresponds to at least one of a stored battery power and a stored fuel level of the vehicle; predicting a change in the energy level using the statistical model, wherein the change in the energy level comprises a function of corresponding input vectors, wherein an input vector is associated with a weight vector, wherein the weight vector represents an overall effect of the input vector on energy consumption of the vehicle, and wherein the change in the energy level is predicted through a regression analysis of the energy level associated with each input vector; and providing results corresponding to the predicted change to an output unit. The weight vector associated with the input vector may be derived using a linear regression that derives the weight vector based on the plurality of input vectors and respective energy levels at the plurality of points in time.

The method may further comprise: predicting a set of input vectors at defined time intervals at a plurality of future points in time based on a subset of the plurality of input vectors generated at the defined time intervals, at the plurality of points in time, wherein the subset of the plurality of input vectors represents the most recent input vectors of the vehicle; deriving a change in the energy level for the plurality of future points in time using the statistical model, wherein the change in the energy level is derived by adding a change in energy level for each defined time interval; capturing an actual change in energy level for each point in time of the plurality of future points in time, wherein the actual change in the energy level is based on the energy level of the vehicle associated with each input vector corresponding to each point in time; computing a difference between the derived change in the energy level and the actual change in the energy level; and refining the weight vector for minimizing the difference between the derived change in the energy level and the actual change in the energy level, wherein refining the weight vector comprises modifying the value of the weight vector to minimize the difference, wherein the statistical model is refit in response to the refined weight vector.

The each input vector may comprise a plurality of sensor data and a plurality of database data, wherein the plurality of sensor data is captured for at least one of a vehicle location environment, a vehicle equipment profile and a driver behavior profile at each point in time of the plurality of points in time, wherein the plurality of sensor data is obtained from a plurality of sensors coupled to the vehicle, wherein the plurality of database data is obtained for at least one of a vehicle location environment, a vehicle equipment profile, and a driver behavior profile for a plurality of vehicles, wherein the plurality of database data is obtained from a database storing previously recorded data for at least one of the vehicle location environment, the vehicle equipment profile, and the driver behavior profile corresponding to the plurality of vehicles. The plurality of sensor data may correspond to at least one of location data, time data, day data, solar radiation data, temperature data, humidity data, barometric pressure data, wind speed data, wind direction data, fuel level data, driving pattern data, and driver identity data associated with the vehicle and an environment around the vehicle.

The plurality of sensors may correspond to at least one of a tire pressure sensor, a regenerative braking sensor, a battery capacity sensor, a battery charge sensor, a solar radiation sensor, a humidity sensor, a temperature sensor, a barometric pressure sensor, a motor temperature sensor, a lubrication level sensor, a wind resistance sensor, a proximity sensor, a weight sensor, an identity sensor, and a set of environmental sensors. The plurality of database data may correspond to at least one of weather data, route data, traffic data, and driving pattern data of a plurality of drivers. The statistical model may comprise at least one of a linear function, a quadratic function, a periodic function, and a rule based function of at least one of a stored energy of the vehicle at each point in time, each vehicle input vector, and each database input vector for each defined time interval, wherein the database input vector is generated based on at least one of a plurality of environmental data and a road condition information.

Another embodiment provides a system for predicting energy consumption of a vehicle using a statistical model, the system comprising: an acquisition module that obtains a plurality of input vectors at defined time intervals at a plurality of points in time; an energy meter that captures an energy level associated with each input vector of the plurality of input vectors at each point in time for the vehicle, wherein the energy meter captures the energy level by capturing at least one of a stored battery power and a stored fuel level of the vehicle; and a processor that predicts a change in energy level using the statistical model, wherein the change in energy comprises a function of corresponding input vectors, wherein an input vector is associated with a weight vector, wherein the weight vector represents an overall effect of the input vector on energy consumption of the vehicle, and wherein the change in energy level is predicted through a regression analysis of the energy level associated with the each input vector. The processor may derive the weight vector associated with the input vector using linear regression of the energy level associated with each input vector at each point in time.

Additionally, the processor may predict a set of input vectors at defined time intervals at a plurality of future points in time based on a subset of the plurality of input vectors generated at the defined time intervals; capture an actual change in energy level for each point in time of the plurality of future points in time, wherein the actual change in the energy level is based on the energy level of the vehicle associated with each input vector corresponding to each point in time; compute a difference between a derived change in the energy level and the actual change in the energy level; and refine the weight vector for minimizing a difference between the derived change in the energy level and the actual change in the energy level, wherein refining the weight vector comprises modifying a value of the weight vector to minimize a difference, wherein the statistical model is refit in response to the refined weight vector.

The acquisition module may acquire a plurality of sensor data for at least one of a vehicle location environment, a vehicle equipment profile, and a driver behavior profile at each point in time of the plurality of points in time, wherein the plurality of sensor data is obtained from a plurality of sensors coupled to the vehicle, wherein the plurality of database data is obtained for at least one of a vehicle location environment, a vehicle equipment profile, and a driver behavior profile for a plurality of vehicles, and wherein the plurality of database data is obtained from a database storing previously recorded data for at least one of the vehicle location environment, the vehicle equipment profile, and the driver behavior profile corresponding to the plurality of vehicles.

The acquisition module may acquire the plurality of sensor data from a plurality of sensors that correspond to at least one of a tire pressure sensor, a regenerative braking sensor, a battery capacity sensor, a battery charge sensor, a solar radiation sensor, a humidity sensor, a temperature sensor, a barometric pressure sensor, a motor temperature sensor, a lubrication level sensor, a wind resistance sensor, a proximity sensor, a weight sensor, an identity sensor, and a set of environmental sensors. The acquisition module may acquire the plurality of database data corresponding to at least one of weather data, route data, traffic data, and driving pattern data of a plurality of drivers. The processor may utilize the statistical model comprising at least one of a linear function, a quadratic function, a periodic function, and a rule based function of at least one of a stored energy of the vehicle at each point in time, each vehicle input vector, and each database input vector for each defined time interval, and wherein the database input vector is generated based on at least one of a plurality of environmental data and road condition information.

These and other aspects of the embodiments herein will be better appreciated and understood when considered in conjunction with the following description and the accompanying drawings. It should be understood, however, that the following descriptions, while indicating preferred embodiments and numerous specific details thereof, are given by way of illustration and not of limitation. Many changes and modifications may be made within the scope of the embodiments herein without departing from the spirit thereof, and the embodiments herein include all such modifications.

BRIEF DESCRIPTION OF THE DRAWINGS

The embodiments herein will be better understood from the following detailed description with reference to the drawings, in which.

DETAILED DESCRIPTION

Figure 1:
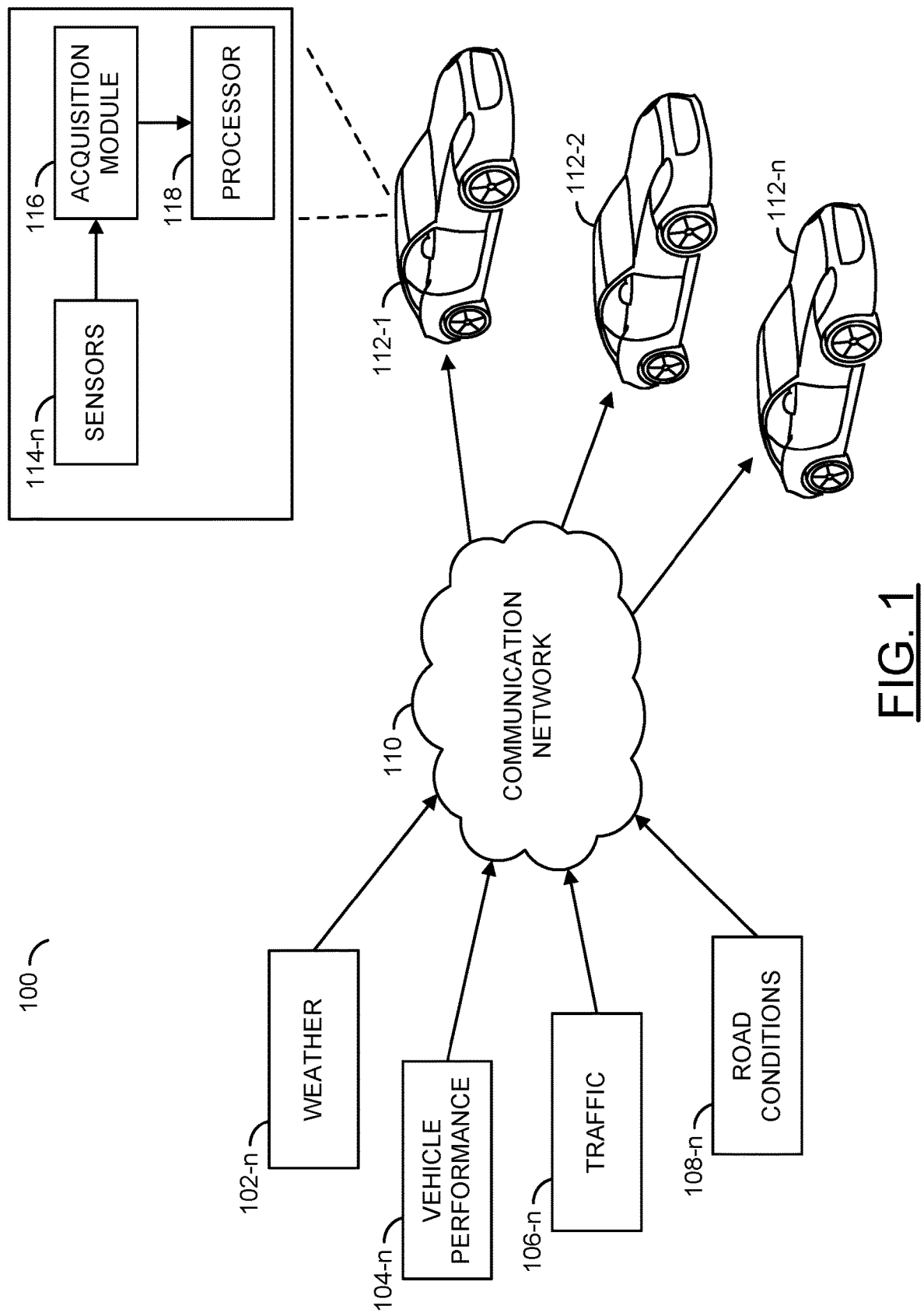
FIG. 1 illustrates an environment in which various embodiments herein may function.

The embodiments herein and the various features and advantageous details thereof are explained more fully with reference to the non-limiting embodiments that are illustrated in the accompanying drawings and detailed in the following description. Descriptions of well-known components and processing techniques are omitted so as to not unnecessarily obscure the embodiments herein. The examples used herein are intended merely to facilitate an understanding of ways in which the embodiments herein may be practiced and to further enable those of skill in the art to practice the embodiments herein. Accordingly, the examples should not be construed as limiting the scope of the embodiments herein.

In this document, relational terms such as first and second, top and bottom, and the like may be used solely to distinguish one entity or action from another entity or action without necessarily requiring or implying any actual such relationship or order between such entities or actions. The terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. An element proceeded by "comprises . . . a" does not, without more constraints, preclude the existence of additional identical elements in the process, method, article, or apparatus that comprises the element.

The embodiments herein provide a method and system for predicting energy consumption of a vehicle using a statistical model. Referring now to the drawings, and more particularly to FIGS. 1 through 5, where similar reference characters denote corresponding features consistently throughout the figures, there are shown preferred embodiments.

In accordance with the embodiments herein, the statistical model utilizes current operating parameters and past operating parameters of the vehicle, location data, environmental data, and road condition information obtained from external sources to predict the energy consumption. The environmental data and the road condition information are collectively termed as database data as they are obtained from external databases such as, but not limited to, various websites and online resources that store environmental data and road data. The operating parameters correspond to, but are not limited to, fuel consumption of the vehicle, braking frequency, and average speed, and the environmental data correspond to, but are not limited to, weather conditions such as intensity of sunlight, thunder, and rain. Further, the road condition information corresponds to, but is not limited to, elevation of road and traffic on one of a known route and an unknown route.

The method and system monitors the operating parameters, environmental data, and road condition information for a plurality of points in time and creates a plurality of input vectors. Each input vector includes a plurality of variables, wherein each variable represents at least one of one or more of the operating parameters, one or more of environmental data, and one or more of road condition information for each point in time. Thereafter, the statistical model is trained with the plurality of input vectors and corresponding energy levels of the vehicle for the plurality of points in time to learn a function between the plurality of variables and the corresponding energy levels. This function is utilized for predicting precise values of the energy consumption under varying operating parameters and weather conditions.

FIG. 1 illustrates an environment 100 in which various embodiments herein may function. Environment 100 includes a plurality of weather sources 102-$n$, a plurality of vehicle performance sources 104-$n$, a plurality of traffic sources 106-$n$, a plurality of road condition sources 108-$n$, a communication network 110, and a plurality of vehicles 112-1, 112-2, . . . , 112-$n$. Further, each vehicle of the plurality of vehicles 112-1, 112-2, . . . , 112-$n$ includes a plurality of sensors 114-$n$, an acquisition module 116, and a processor 118. As shown in FIG. 1, weather sources 102-$n$, vehicle performance sources 104-$n$, traffic sources 106-$n$, and road condition sources 108-$n$ are operatively connected to vehicles 112-1, 112-2, . . . , 112-$n$ through communication network 110. Weather sources 102-$n$ provide weather information such as, but not limited to, solar radiation data, probability of rain data, temperature and direction of wind data to vehicles 112-1, 112-2, . . . , 112-$n$ for a plurality of points in time.

Weather sources 102-$n$ correspond to, but are not limited to, various agencies and websites that provide the latest updates on weather and meteorological data. For instance, the weather information can be one of a weather forecast and a solar radiation data from the National Oceanic and Atmospheric Administration (NOAA) that is utilized for solar power inputs based on the location of the vehicle and a projected route. The weather information can be used by a driver to determine the suitability of driving on a particular route with known weather conditions. Vehicle performance sources 104-$n$ provide performance data such as, but not limited to, average speed, acceleration, mileage, battery capacity, and fuel consumption of other vehicles to a vehicle 112-1, for example. Traffic sources 106-$n$ provide traffic data of a particular route. Traffic sources 106-$n$ correspond to, but are not limited to, online agencies and websites that provide real time data about traffic of a route through the Internet. Road conditions sources 108-$n$ provide road condition data such as, but not limited to, road elevation, quality of road, and level of the road to vehicles 112-$n$.

Sensors 114-$n$ are installed in each vehicle of the vehicles 112-1, 112-2, . . . , 112-$n$ for capturing a plurality of sensor data for each vehicle 112-1, 112-2, . . . , 112-$n$. Each sensor of a vehicle 112-1, for example, is located at a different position within vehicle 112-1 to capture one or more sensor data of the plurality of sensor data for a particular point in time. The one or more sensor data represents operating conditions of vehicle 112-1 at the point in time. For instance, a tire pressure sensor (not shown) may be located over the tires of vehicle 112-1 to capture the tire pressure data and the wind resistance sensor may be located on a front side of vehicle 112-1 to capture the wind resistance data at a particular point in time. The sensor data corresponds to, but is not limited to, tire pressure data, location data, time data, day data, regenerative braking data, battery capacity data, solar radiation data, humidity data, outside temperature data, barometric pressure data, motor temperature data, motor lubrication level data, and wind resistance data.

The sensor data also corresponds to proximity data, environmental data, velocity, acceleration, location data, direction data, inclination data, angular momentum data, weight data of a driver, and identity data of the driver. Acquisition module 116 obtains the weather information from at least one of the weather sources 102-$n$, the performance data of other vehicles from at least one of the vehicle performance sources 104-$n$, the traffic data from at least one of the traffic sources 106-$n$, the road condition data from at least one of the road condition sources 108-$n$, and the plurality of sensor data from sensor 114-$n$ and delivers the obtained data to processor 118. Although, a single acquisition module 116 is considered to acquire the weather information, the performance data, the traffic data, the road condition data, and the plurality of sensor data, those skilled in the art would realize that one could use two or more acquisition modules in a vehicle 112-1, 112-2, . . . , 112-$n$. Sensor 114-$n$ corresponds to at least one of a tire pressure sensor, a regenerative braking sensor, a battery capacity sensor, a battery charge sensor, a solar radiation sensor, a humidity sensor, a temperature sensor, a barometric pressure sensor, a motor temperature sensor, a lubrication level sensor, a wind resistance sensor, a proximity sensor, a weight sensor, an identity sensor, and a set of environmental sensors. Processor 118 then processes the obtained data and predicts energy consumption of vehicle 112-1, 112-2, . . . , 112-$n$.

Figure 2:
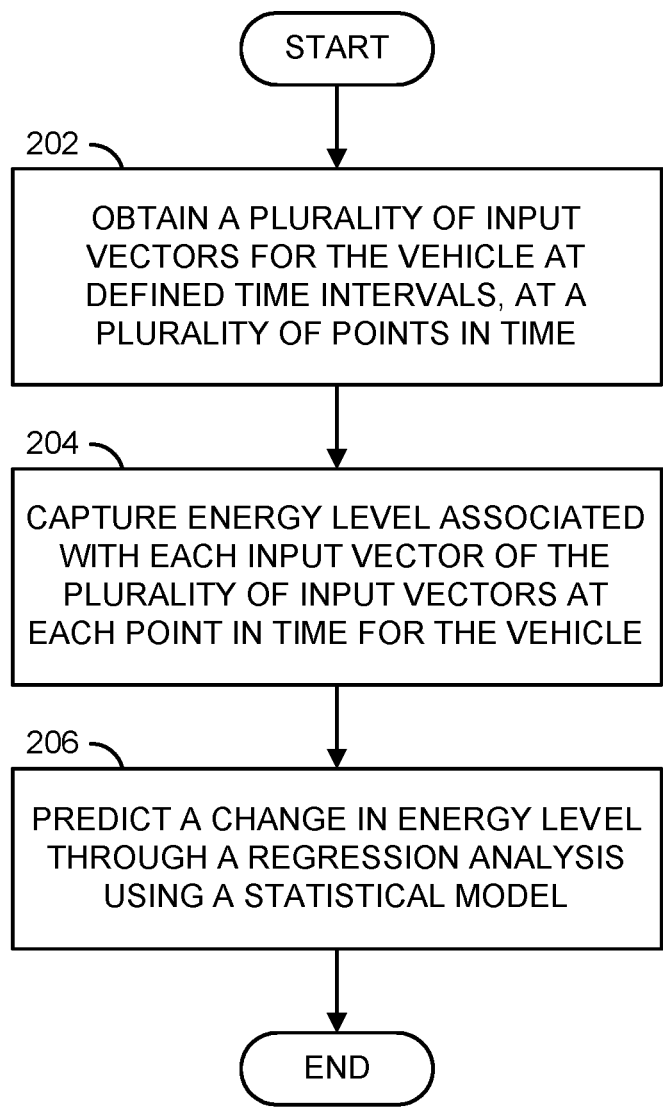
FIG. 2 illustrates a flow diagram of a method for predicting energy consumption of a vehicle in accordance with various embodiments herein.

FIG. 2, with reference to FIG. 1, illustrates a flow diagram of a method for predicting the energy consumption of vehicle 112-1, 112-2, . . . , 112-$n$ in accordance with the embodiments herein. At step 202, the plurality of input vectors is obtained for vehicle 112-1, for example, for the plurality of points in time. The plurality of input vectors is obtained in the form of the weather information data, the performance data, the traffic data, the road condition data, and the plurality of sensor data. Thereafter, at step 204, the energy level associated with each input vector is captured. The energy level is captured based on the remaining battery level or a fuel level for the vehicle 112-1 for each point in time. An input vector with a corresponding energy level for a point in time represents an equation that describes a state of vehicle 112-1 in terms of the one or more of the plurality of sensor data for the point in time, the one or more of the plurality of performance data for the point in time, the one or more of the plurality of weather data for the point in time, and the one or more of the plurality of traffic data for the point in time. The equation is obtained based on a function of one or more of the plurality of sensor data for a point in time, a function of one or more of the plurality of performance data for the point in time, a function of one or more of the plurality of weather data for the point in time, and a function of one or more of the plurality of traffic data for the point in time.

A weight vector is associated with each variable of the plurality of variables and is estimated based on an overall effect of a corresponding variable on energy consumption of vehicle 112-1. Here, the weight vector is derived using a linear regression, in one example embodiment (and other techniques may also be used in accordance with the embodiments herein), wherein the linear regression derives the weight vector based on the plurality of input vectors and the corresponding energy levels. Thereafter, at step 206, the energy consumption of vehicle 112-1 is predicted based on the statistical model using regression analysis. In an embodiment, the statistical model is a linear function of the plurality of input vectors. In another embodiment, the statistical model is a quadratic function. In yet another embodiment, the statistical model is one of a periodic function and a rule based function of at least one of a stored energy at each point in time, a vehicle input vector, and a database input vector. The database input vector is generated based on the database data such as, but is not limited to, the environmental data and the road condition information, and the vehicle input vector is generated based on the plurality of sensor data.

Figure 3:
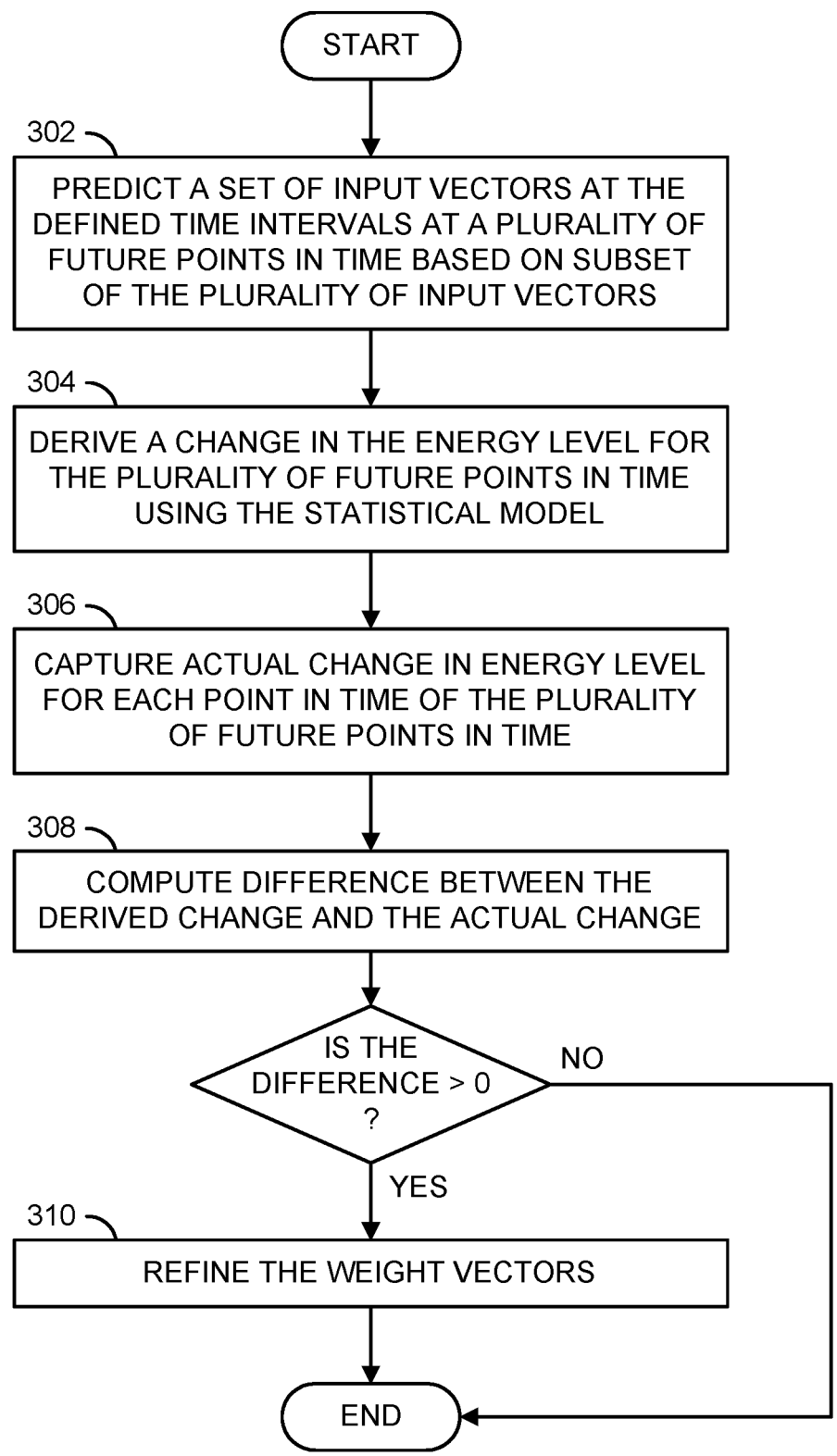
FIG. 3 illustrates a flow diagram of a method for refining weight vectors associated with an input vector for predicting energy consumption of the vehicle in accordance with an embodiment herein.

FIG. 3, with reference to FIGS. 1 and 2, illustrates a flow diagram of a method for refining the weight vectors associated with an input vector for predicting energy consumption of a vehicle 112-1, for example, in accordance with the embodiments herein. At step 302, a set of input vectors are predicted at the plurality of future points in time based on a subset of the plurality of input vectors. The subset represents the most recent input vectors. Thereafter at step 304, a change in energy level for vehicle 112-1 is derived for the plurality of future points in time using the statistical model. Although, the statistical model is utilized for deriving the change in energy level, a person skilled in the art would realize the use of a functionally equivalent mathematical model for deriving the change in energy level could be utilized in accordance with the embodiments herein. After deriving the change in energy level, the actual change in energy level is captured at each point in time of the plurality of future points in time at step 306. Subsequently, the method includes a step 308 of computing a difference between the derived change in energy level and the actual change in the energy level. If the difference between the derived change in energy level and the actual change in energy level is greater than zero, then according to step 310, the weight vectors are refined in order to minimize the difference.

In an exemplary embodiment, an input vector is given as: $v(t)=[a_2, a_2, a_3, \ldots a_n]$, where $[a_1 \ldots a_n]$ represents values of one or more of the plurality of sensor data, one or more of the weather information, one or more of the traffic data, and one or more of road condition data collected for a point in time t. The variable v(t) represents an expansion of the input vector with expanded terms for one of a quadratic function and periodic function. A corresponding energy level for the input vector is determined as:

$$e(t)=f_1(a_1)+f_2(a_2)+f_3(a_3) \ldots +f_n(a_n), \quad (1)$$

where e(t) represents a change in energy as a function of the input vector. For a linear equation, the weight vector is defined as:

$$e(t)=w_1*a_1+w_2*a_2+ \ldots w_n*a_n \quad (2)$$

As the weight vector is also in a vector form [w1, w2, w3, . . . wn], then Eq. (2) is modified to a form:

$$e(t)=w_T*v(t) \quad (3)$$

where $w_T$ represents the transform of the weight vector w.

When the values for v(t) and actual e(t) are available for enough points in time, then a value for w is derived. Thereafter, one of a future e(t) and change in energy at the future time is predicted based on the value of w and a predicted future v(t+1) for near future points in time and location.

Figure 4:
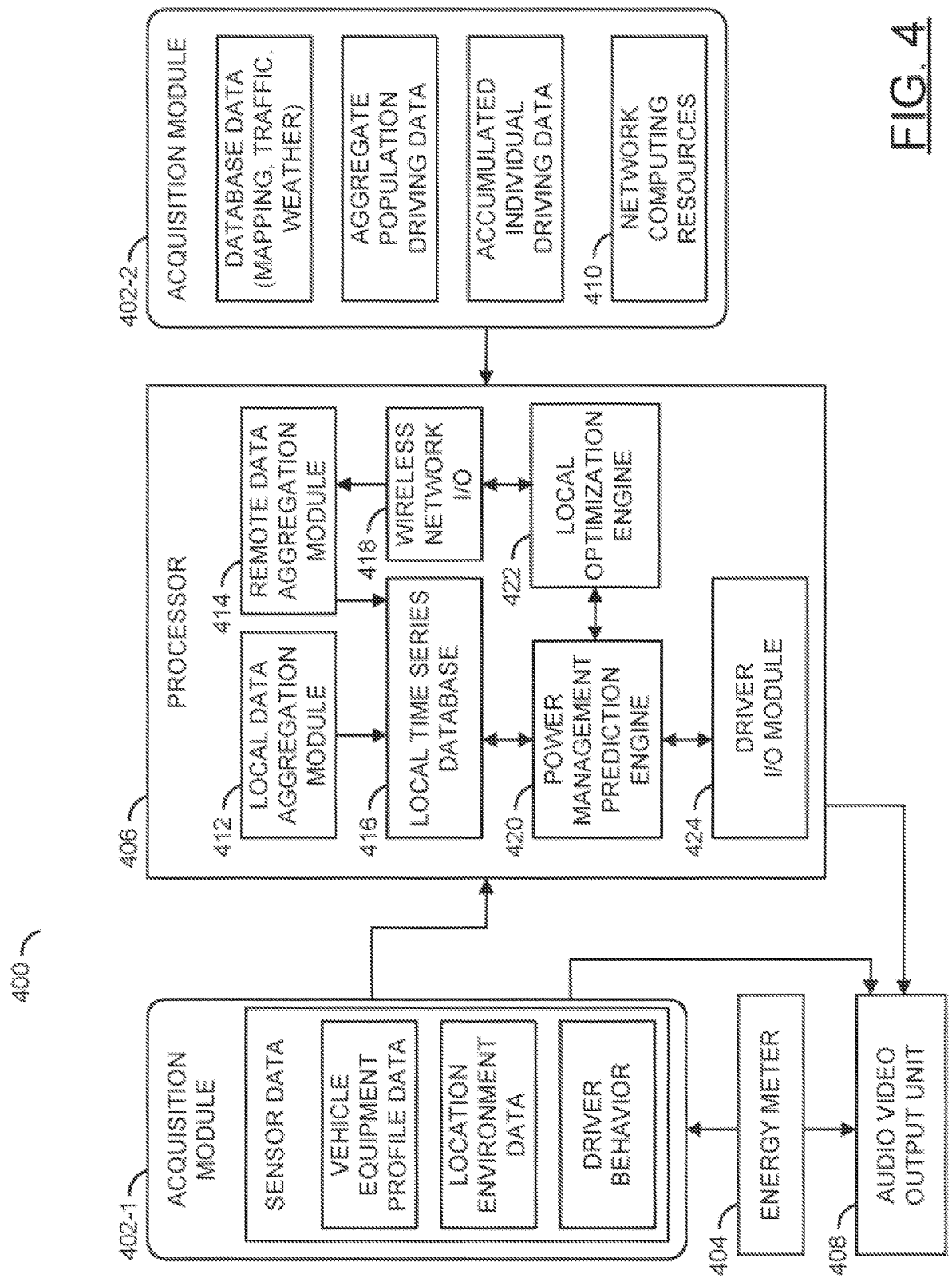
FIG. 4 illustrates a system for predicting energy consumption of a vehicle in accordance with an embodiment herein.

FIG. 4, with reference to FIGS. 1 through 3, illustrates a system 400 for predicting the energy consumption of vehicle 112-1, for example, in accordance with the embodiments herein. System 400 includes an acquisition module 402-1 to obtain the plurality of sensor data which includes vehicle equipment profile data, location environment data, and driver behavior data from sensors 114-n. The vehicle equipment profile data corresponds to data associated with the operating status of various equipment, devices, and components of vehicle 112-1 such as, but not limited to, wear and tear of tires and the energy level of the battery or stored fuel level of vehicle 112-1. The driver behavior data corresponds to a driving pattern of the driver such as, but not limited to, the average speed, frequency of applying brakes, and driving time in a day. As shown in FIG. 4, two acquisition models 402-1 and 402-2 are configured for system 400, however a person skilled in the art would realize the use of a single or more than two acquisition modules as well in accordance with the embodiments herein. Acquisition module 402-1 is coupled to an energy meter 404 to obtain the energy level of vehicle 112-1. The energy meter 404 is a component of the vehicle 112-1 to capture the energy level of vehicle 112-1 for each input vector of the plurality of input vectors for the plurality of points in time. The energy meter 404 captures the energy level by capturing either a stored battery power or a stored fuel level of the vehicle 112-1. Thereafter, acquisition module 402-1 delivers the plurality of sensor data and the energy level to a processor 406 for processing. Additionally, an audio-video (AV) output unit 408 is coupled to energy meter 404 to provide the energy level on a display unit (not shown) of AV output unit 408 in any one of an audio format and a video format.

Acquisition module 402-2 includes network computer resources 410 to communicate through communication network 110 to obtain the database data such as, but not limited to, mapping data, traffic data, a route data, the weather information data, aggregate population data for other vehicles, and accumulated individual driving data. Acquisition modules 402-1 and 402-2 obtain the data in the form of a plurality of input vectors for the plurality of points in time. Processor 406 utilizes machine learning to generate a statistical model based on the equation for each input vector and the corresponding energy level. Machine learning is an algorithm or a program that is utilized to train a computer system to perform certain operation without any explicit direction from a programmer. The computer system is trained by learning past operations and their respective outcomes and predicts a current outcome or a future outcome based on a set of current operations that are similar to the past operations.

The method and system provided by the embodiments herein utilize the machine learning to learn respective energy levels captured for the plurality of input vectors for the plurality of points in time and derive a relationship between the plurality of input vectors and the respective energy levels. The relationship is derived in terms of the statistical model which learns varying energy levels of the vehicle corresponding to varying input vectors for the plurality of points in time. The statistical model then utilizes available input vectors to predict a future energy level of the vehicle 112-1, for example. Processor 406 derives the weight vectors associated with the plurality of input vectors using linear regression, in one example embodiment. Processor 406 includes a local data aggregation module 412 to receive data from acquisition module 402-1 and a remote data aggregation module 414 to receive data from acquisition module 402-2. The received data is then delivered to local time series database 416, which stores the received data as past input vectors and current input vectors along with their corresponding energy levels for each point in time.

Remote data aggregation module 414 receives the data through a wireless network I/O 418 that is configured to receive an input and deliver an output through communication network 110. Local time series database 416 is coupled to a power management prediction engine 420 that is configured to receive the plurality of input vectors in order to predict the energy consumption of vehicle 112-1 by utilizing the statistical model. Power management prediction engine 420 is coupled to a local optimization engine 422 for sending the predicted energy consumption. Local optimization engine 422 is configured to optimize the weight vectors associated with each variable of each input vector of the plurality of input vectors based on the difference between the derived energy level change and the actual energy level change. The predicted energy consumption is also delivered to a driver I/O module 424, wherein the driver I/O module 424 is utilized by a driver of the vehicle (not shown) for any of entering inputs and receiving outputs related to the energy consumption of vehicle 112-1.

Processor 406 predicts a set of input vectors at defined time intervals at the plurality of future points in time based on a subset of the plurality of input vectors generated at the defined time intervals. Thereafter, processor 406 captures an actual change in energy level for each point in time of the plurality of future points in time, wherein the actual change in the energy level is based on the energy level of the vehicle 112-1, 112-2, . . . , 112-*n* associated with each input vector corresponding to each point in time. Processor 406 then computes a difference between the derived change in the energy level and the actual change in the energy level and refines the weight vector for minimizing the difference between the derived change in the energy level and the actual change in the energy level.

Various embodiments herein provide a method and system for predicting the energy consumption of a vehicle 112-1, for example, based on a statistical model. The method and system provide an efficient way of predicting energy consumption of the vehicle 112-1 and thereby improving accuracy of the prediction. The method and system finds its application in predicting a most energy efficient route by executing the statistical model over various possible routes and calculating the power consumed. Further, the method and system facilitates in predicting how far the vehicle 112-1 can travel along a given route based on power consumption and power generation potential of the vehicle 112-1. Furthermore, the method and system facilitate predicting whether it is cost effective to add a solar panel or other power saving or generating feature to an electric car by analyzing the driving behavior over a particular time period.

The embodiments herein can include both hardware and software elements. The embodiments that are implemented in software include but are not limited to, firmware, resident software, microcode, etc. For example, the microcontroller can be configured to run software either stored locally or stored and run from a remote site.

Furthermore, the embodiments herein can take the form of a computer program product accessible from a computer-usable or computer-readable medium providing program code for use by or in connection with a computer or any instruction execution system. For the purposes of this description, a computer-usable or computer readable medium can be any apparatus that can comprise, store, communicate, propagate, or transport the program for use by or in connection with the instruction execution system, apparatus, or device.

The medium can be an electronic, magnetic, optical, electromagnetic, infrared, or semiconductor system (or apparatus or device) or a propagation medium. Examples of a computer-readable medium include a semiconductor or solid state memory, magnetic tape, a removable computer diskette, a random access memory (RAM), a read-only memory (ROM), a rigid magnetic disk and an optical disk. Current examples of optical disks include compact disk-read only memory (CD-ROM), compact disk-read/write (CD-R/W) and DVD.

A data processing system suitable for storing and/or executing program code will include at least one processor coupled directly or indirectly to memory elements through a system bus. The memory elements can include local memory employed during actual execution of the program code, bulk storage, and cache memories which provide temporary storage of at least some program code in order to reduce the number of times code must be retrieved from bulk storage during execution.

Input/output (I/O) devices (including but not limited to keyboards, displays, pointing devices, etc.) can be coupled to the system either directly or through intervening I/O controllers.

Network 104 adapters may also be coupled to the system to enable the data processing system to become coupled to other data processing systems or remote printers or storage devices through intervening private or public network 104*s*. Modems, cable modem and Ethernet cards are just a few of the currently available types of network 104 adapters.

Figure 5:
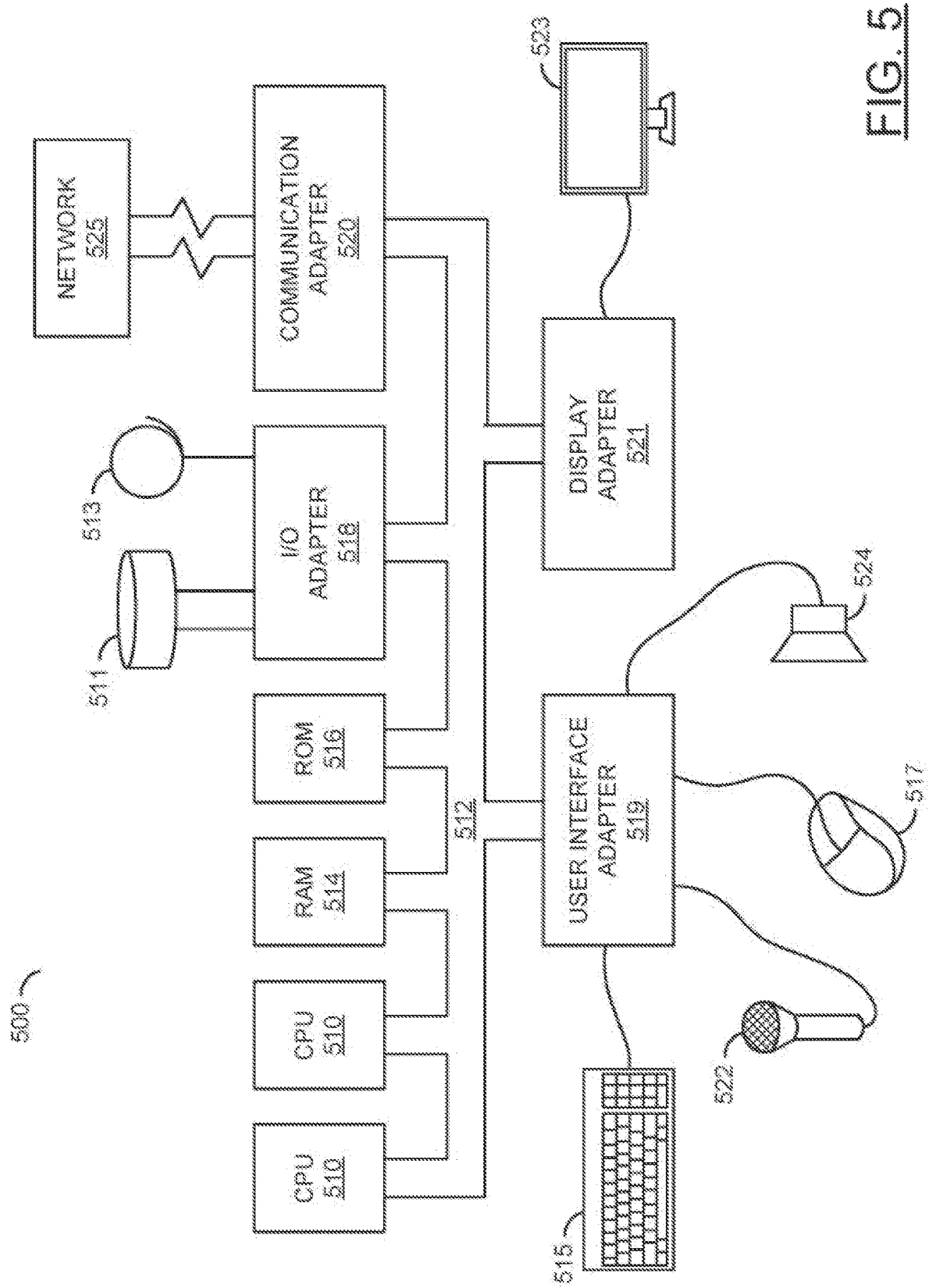
FIG. 5 illustrates a schematic diagram of a computer architecture used in accordance with the embodiments herein.

A representative hardware environment for practicing the software embodiments either locally or remotely is depicted in FIG. 5, with reference to FIGS. 1 through 4. This schematic drawing illustrates a hardware configuration of an information handling/computer system 500 in accordance with the embodiments herein. The system 500 comprises at least one processor or central processing unit (CPU) 510. The CPUs 510 are interconnected via system bus 512 to various devices such as a random access memory (RAM) 514, read-only memory (ROM) 516, and an input/output (I/O) adapter 518. The I/O adapter 518 can connect to peripheral devices 511, 513, or other program storage devices that are readable by the system 500. The system 500 can read the inventive instructions on the program storage devices and follow these instructions to execute the methodology of the embodiments herein. The system 500 further includes a user interface adapter 519 that connects a keyboard 515, mouse 517, speaker 524, microphone 522, and/or other user interface devices such as a touch screen device (not shown) to the bus 512 to gather user input. Additionally, a communication adapter 520 connects the bus 512 to a data processing network 525, and a display adapter 521 connects the bus 512 to a display device 523 which may be embodied as an output device such as a monitor, printer, or transmitter, for example.

The foregoing description of the specific embodiments will so fully reveal the general nature of the embodiments herein that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, while the embodiments herein have been described in terms of preferred embodiments, those skilled in the art will recognize that the embodiments herein can be practiced with modification within the spirit and scope of the appended claims.

The invention claimed is:

1. A method performed by one or more processors for predicting energy consumption of a vehicle using a statistical model and indicating, one of visually and audibly, results corresponding to a predicted change in energy level to a driver of the vehicle, said method comprising:

predicting a set of future input vectors for said vehicle at defined time intervals corresponding to a plurality of future points in time based on a subset of a plurality of reference input vectors previously generated at the defined time intervals at a plurality of previous points in time, the subset including a most recent reference input vector, wherein an energy level of said vehicle is associated with each reference input vector of said plurality of reference input vectors at each previous point in time of said plurality of previous points in time, each reference input vector comprises a vehicle input vector and a database input vector associated with each point in time of said plurality of previous points in time, said vehicle input vector for each defined time interval is based at least in part on one or more vehicle operating parameters, and said database input vector for each defined time interval is based at least in part on a plurality of environmental data and information about a road condition;

predicting a change in said energy level of said vehicle using a processor and said statistical model, wherein (i) the change in said energy level comprises a function of corresponding future input vectors and an associated weighting vector, said weighting vector having been derived using said plurality of reference input vectors and associated energy levels at each point in time of said plurality of previous points in time, and representing an overall effect of each input vector on energy consumption of said vehicle, and (ii) said change in said energy level is predicted based on a regression analysis of said energy level associated with each of said reference input vectors; and providing results corresponding to the predicted change in said energy level to an audio-video output unit of said vehicle and providing the results, using the audio-video output unit, to a driver of the vehicle;

wherein each vehicle input vector comprises a plurality of sensor data and each database input vector comprises a plurality of database data;

wherein said statistical model comprises at least one of a linear function and a periodic function of at least one of a stored energy of the vehicle at each point in time, each vehicle input vector, and each database input vector for each defined time interval, and wherein the statistical model is generated using machine learning based on an equation for each input vector; and wherein said plurality of sensor data is captured for a vehicle location environment, a vehicle equipment profile, and a driver behavior profile at each point in time of said plurality of previous points in time.

2. The method according to claim 1, wherein said plurality of sensor data is obtained from a plurality of sensors associated with said vehicle, and wherein the statistical model models one of the energy level of the vehicle and the change of the energy level of the vehicle as a function of the sensor data, vehicle performance data, weather data, traffic data, and road condition data.

3. The method according to claim 2, wherein said plurality of sensors correspond to at least one of a regenerative braking sensor, a solar radiation sensor, a weight sensor, and an identity sensor.

4. The method according to claim 1, wherein said plurality of database data is obtained for a plurality of vehicles and comprises data related to a vehicle location environment, a vehicle equipment profile, a driver behavior profile, average speed, acceleration, mileage, battery capacity, and fuel consumption.

5. The method according to claim 4, wherein said plurality of database data is obtained from a database storing previously recorded data for said vehicle location environment, said vehicle equipment profile, and said driver behavior profile corresponding to said plurality of vehicles, and wherein the method facilitates predicting a cost effectiveness of adding one of a power saving feature and a power generating feature to the vehicle based on the driver behavior profile.

6. The method according to claim 1, wherein said plurality of sensor data corresponds to time data, day data, wind direction data, driving pattern data, driver identity, velocity data, acceleration data, inclination data, and angular momentum data.

7. The method according to claim 1, wherein said plurality of database data corresponds to weather data, route data, traffic data, and driving pattern data of a plurality of drivers, and wherein the method includes predicting a most energy-efficient route by executing the statistical model over a plurality of possible routes and predicting an amount of power consumed for each possible route.

8. The method of claim 1, wherein each reference input vector is associated with each of the previous points in time, and wherein the processor includes a plurality of data aggregation modules to receive data and deliver the data to a time series database which stores the data as the reference input vectors along with corresponding energy levels for each previous point in time.

9. The method of claim 1, further comprising capturing an energy level associated with each reference input vector at each of the previous points in time using an energy meter that captures at least one of a stored battery power and a stored fuel level.

10. The method of claim 1, wherein the weighting vector is derived using a linear regression.

11. The method of claim 1, further comprising, using an optimization engine, capturing an actual change in energy level for each of the future points in time based on the energy level associated with each reference input vector, computing a difference between the predicted change in energy level and the actual change in energy level, and refining the weighting vector to minimize the difference between the predicted change in energy level and the actual change in energy level.

12. The method of claim 11, wherein refining the weighting vector comprises modifying a value of the weighting vector, and wherein the statistical model is refit in response to refining the weighting vector.

13. A system for predicting energy consumption of a vehicle using a statistical model and for displaying results corresponding to a predicted change in energy level to a driver of the vehicle, said system comprising:
an acquisition module that obtains a plurality of reference input vectors at defined time intervals at a plurality of points in time, wherein each input vector comprises a vehicle input vector and a database input vector associated with each point in time of said plurality of points in time, said vehicle input vector is generated for each defined time interval based at least in part on one or more vehicle operating parameters, and said database input vector is generated for each defined time interval based at least in part on a plurality of environmental data and information about a road condition;
a processor that predicts (i) a set of future input vectors for said vehicle at defined time intervals corresponding to a plurality of future points in time based on a subset of a plurality of reference input vectors previously obtained at the defined time intervals at a plurality of previous points in time, wherein an energy level of said vehicle is associated with each reference input vector of said plurality of reference input vectors at each previous point in time of said plurality of previous points in time, each reference input vector comprises a vehicle input vector and a database input vector associated with each point in time of said plurality of previous points in time, and said database input vector for each defined time interval is based on at least one of a plurality of environmental data and information about a road condition, and (ii) a change in said energy level of said vehicle using said statistical model, wherein the change in said energy level comprises a function of corresponding future input vectors and an associated weighting vector, said weighting vector is derived using said plurality of reference input vectors and associated energy levels at each point in time of said plurality of previous points in time, said weighting vector represents an overall effect of each input vector on energy consumption of said vehicle, and said change in said energy level is predicted based on a regression analysis of said energy level associated with each of said reference input vectors; and
an audio-video output unit that displays results corresponding to the predicted change in said energy level of said vehicle to a driver of the vehicle;
wherein said acquisition module acquires a plurality of sensor data for at least one of a vehicle equipment profile and a driver behavior profile at each point in time of said plurality of points in time, wherein said plurality of sensor data is obtained from a plurality of sensors coupled to said vehicle, wherein said plurality of database data is obtained for a vehicle equipment profile and a driver behavior profile for a plurality of vehicles, wherein said processor utilizes said statistical model comprising at least one of a linear function and a periodic function of at least one of a stored energy of said vehicle at each point in time, each vehicle input vector, and each database input vector for each defined time interval, and wherein said plurality of database data is obtained from a database storing previously recorded data for said vehicle equipment profile and said driver behavior profile corresponding to said plurality of vehicles.

14. The system according to claim 13, wherein said acquisition module acquires said plurality of sensor data from a plurality of sensors that correspond to at least one of a regenerative braking sensor, a solar radiation sensor, a weight sensor, an identity sensor, a velocity sensor, an acceleration sensor, an inclination sensor, and an angular momentum sensor.

15. The system according to claim 13, wherein said acquisition module acquires said plurality of database data corresponding to weather data, route data, traffic data, and driving pattern data of a plurality of drivers, and wherein the acquisition module also acquires said plurality of database data corresponding to road elevation, road quality, and road level.

16. The system of claim 13, wherein the plurality of variables comprise a plurality of vehicle operating parameters including energy consumption, braking frequency, average speed, and driving time per day, and wherein the at least one variable representing a road condition represents one of elevation, traffic on a known route, and traffic on an unknown route.

17. A non-transitory program storage device readable by a computer, and comprising a program of instructions executable by said computer to perform a method for predicting energy consumption of a vehicle using a statistical model and for indicating, one of visually and audibly, results corresponding to a predicted change in energy level to a driver of the vehicle, said method comprising:
using one or more processors, predicting a set of future input vectors for said vehicle at defined time intervals corresponding to a plurality of future points in time based on a subset of a plurality of reference input vectors previously generated at the defined time intervals at a plurality of previous points in time, wherein an energy level of said vehicle is associated with each reference input vector of said plurality of reference input vectors at each previous point in time of said plurality of previous points in time, each reference input vector comprises a vehicle input vector and a database input vector associated with each point in time of said plurality of previous points in time, said vehicle input vector for each defined time interval is based at least in part on one or more vehicle operating parameters, and said database input vector for each defined time interval is based at least in part on a plurality of environmental data and information about a road condition;
using the one or more processors, predicting a change in said energy level of said vehicle using said statistical model, wherein (i) the change in said energy level comprises a function of corresponding future input vectors and an associated weighting vector, said weighting vector having been derived using said plurality of reference input vectors and associated energy levels at each point in time of said plurality of previous points in time, and representing an overall effect of each input vector on energy consumption of said vehicle, and (ii) said change in said energy level is predicted based on a regression analysis of said energy level associated with each of said reference input vectors; and using the one or more processors, providing results corresponding to the predicted change in said energy level to an audio-video output unit of said vehicle and providing the results, using the audio-video output unit, to a driver of the vehicle;

wherein said statistical model comprises at least one of a linear function and a periodic function of at least one of an energy level of the vehicle at each point in time, each vehicle input vector, and each database input vector for each defined time interval.

18. The program storage device according to claim 17, wherein each vehicle input vector comprises a plurality of sensor data and a plurality of database data, wherein said plurality of sensor data is captured for at least one of a vehicle equipment profile and a driver behavior profile at each point in time of said plurality of previous points in time, wherein said plurality of sensor data is obtained from a plurality of sensors coupled to said vehicle, wherein said plurality of database data is obtained for a vehicle equipment profile and a driver behavior profile for a plurality of vehicles, and wherein said plurality of database data is obtained from a database storing previously recorded data for said vehicle equipment profile and said driver behavior profile corresponding to said plurality of vehicles, wherein the vehicle equipment profile includes data regarding wear and tear of tires and one of energy level of a battery and stored fuel level, and wherein the driver behavior profile includes average speed, frequency of applying brakes, and driving time per day.

* * * * *